United States Patent [19]

Okamoto et al.

[11] Patent Number: 4,903,117
[45] Date of Patent: Feb. 20, 1990

[54] SEMICONDUCTOR DEVICE

[75] Inventors: Tatsuo Okamoto; Ikuo Ogoh, both of Itami, Japan

[73] Assignee: Mitsubishi Denki Kabushiki Kaisha, Tokyo, Japan

[21] Appl. No.: 203,445

[22] Filed: Jun. 7, 1988

Related U.S. Application Data

[63] Continuation of Ser. No. 904,705, Sep. 8, 1986, abandoned.

[30] Foreign Application Priority Data

Sep. 11, 1985 [JP]  Japan ................................ 60-201009

[51] Int. Cl.⁴ ........................................... H01L 23/54
[52] U.S. Cl. ......................................... 357/71; 357/68
[58] Field of Search ............................. 357/67, 73, 71

[56] References Cited

U.S. PATENT DOCUMENTS 4,271,424  6/1981  Inayoshi et al. ...................... 357/67
4,321,612  3/1982  Murata et al. ....................... 357/73

OTHER PUBLICATIONS

"The Use of Titanium—Based Contact Barrier Layers in Silicon Technology", C. Y. Ting et al., Thin Solid Films, 96 (1982), Electronics and Optics, pp. 327–345.

Primary Examiner—Rolf Hille
Assistant Examiner—S. V. Clark
Attorney, Agent, or Firm—Lowe, Price, Leblanc, Becker & Shur

[57] ABSTRACT

A silicon oxide film and a BPSG film are formed on a silicon substrate to serve as insulating films, and a contact hole is selectively formed in the insulating films. An impurity diffusion layer is formed on the surface layer of the semiconductor substrate at the bottom portion of the contact hole. A second metal film serving as a metal electrode is formed to cover the BPSG film and the impurity diffusion layer, and a first metal film serving as a barrier layer is formed between the second metal film and the BPSG film and impurity diffusion layer. The first metal film prevents boron contained in the BPSG film from being diffused in the second metal film, thereby to prevent precipitation of silicon in the contact hole.

13 Claims, 1 Drawing Sheet

SMALL ASPECT RATIO      LARGE ASPECT RATIO

SMALL ASPECT RATIO    LARGE ASPECT RATIO

SEMICONDUCTOR DEVICE

This application is a continuation of application Ser. No. 904,705, filed Sept. 8, 1986, now abandoned.

BACKGROUND OF THE INVENTION

1. Field of the Invention

The present invention relates to a semiconductor device, and more particularly, it relates to a semiconductor device employing a BPSG film as an insulating film in a very-large-scale integrated circuit (VLSI).

2. Description of the Prior Art

FIG. 2 is a sectional view showing the structure of a conventional semiconductor device which employs a thermal oxidation film of silicon and a silicon oxide film (PSG film) containing phosphorus (P) as insulating films and an aluminum alloy film containing silicon as an interconnection metal film. Referring to FIG. 2, description is now made of the metal electrode interconnection structure of the conventional semiconductor device. First, as shown in FIG. 2, a silicon oxide film 3 and a PSG film 8 are formed on the surface of a silicon substrate 1, and thereafter a contact hole 7 is selectively formed through photolithography or etching. Then an impurity diffusion layer 2 is formed in the vicinity of the surface of the silicon substrate 1 through ion implantation or thermal diffusion. Finally an aluminum alloy film 6 containing silicon is formed through sputtering, chemical vapor deposition (CVD) or the like, to be sintered by heat treatment.

In such a conventional semiconductor device employing the PSG film 8 as an insulating film, it is necessary to increase the temperature for heat treatment or the content of phosphorus to effectively perform flattening with an increase in the aspect ratio (ratio of film thickness to patterning pitch) of the circuit pattern following refinement of the element as shown in FIG. 4. However, the increase in temperature exerts a bad influence on impurity distribution in the element while the increase in the content of phosphorus leads to degradation in moisture resistance. Therefore, a BPSG film (silicon oxide film containing boron B and phosphorus P) is now being watched as a second material for the insulating film since the same shows lower viscosity at the general treating temperature. However, when a BPSG film 4 (FIG. 3) is employed as an insulating film for the conventional semiconductor device as shown in FIG. 2, boron contained in the BPSG film 4 is diffused in the vicinity of the surface of the silicon substrate 1 at the bottom of the contact hole 7 or in the aluminum alloy film 6 containing silicon, to promote movement of the silicon in the aluminum alloy film 6. Thus, a large amount of silicon 9 is precipitated by solid-phase epitaxial growth in the interface between the silicon substrate 1 and an electrode after heat treatment, to increase contact resistance by about one or two figures. Such a problem is remarkable particularly when the content of boron in the BPSG film 4 exceeds 1 percent by weight.

As the prior art of interest to the present invention, "The Use of Titanium-Based Contact Barrier Layers in Silicon Technology", Thin Solid films, 96(1982) pp. 327-345, Electronics and Optics, C. Y. Ting and M. Wittmer, IBM. T. J. Watson R & D discloses that titanium alloy is suitable as a barrier metal for preventing reaction between aluminum and silicon. In this prior art, however, there is no disclosure about employment of a BPSG film as an insulating film for a semiconductor device and structure for preventing precipitation of silicon caused upon employment of the BPSG film. Thus, this prior art is not suggestive of the present invention, although the same employs a barrier metal similarly to the present invention.

SUMMARY OF THE INVENTION

An object of the present invention is to provide a semiconductor device which can effectively flatten the circuit pattern in a very-large-scale integrated circuit while being in excellent ohmic contact of low resistance.

Briefly stated, the semiconductor device according to the present invention employs a BPSG film as a second insulating film and an aluminum alloy film containing silicon as a second metal film to serve as a metal electrode, so that a first metal film is formed between the second insulating film and the second metal film to serve as a barrier layer, thereby to prevent boron contained in the second insulating film from being diffused in the second metal film.

According to the present invention, the second insulating film (BPSG film) is effective for flattening irregularity on a circuit pattern having a large aspect ratio, while the first metal film prevents boron contained in the second insulating film from being diffused in the second metal film, thereby to prevent selective solid-phase epitaxial growth of the silicon in the second metal film on the surface of a silicon substrate at the bottom of a contact hole.

Therefore, according to the present invention, excellent ohmic contact can be obtained while flattening the circuit surface, even if the circuit pattern of a very-large-scale integrated circuit is refined.

These and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
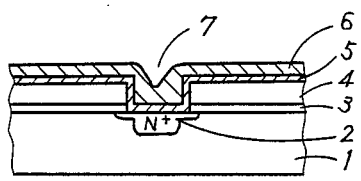
FIG. 1 is a sectional view showing the structure of a semiconductor device according to an embodiment of the present invention.
Figure 2:
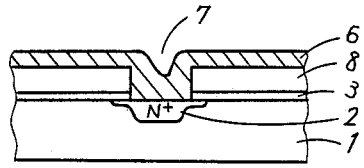
FIG. 2 is a sectional view showing the structure of a conventional semiconductor device.
Figure 3:
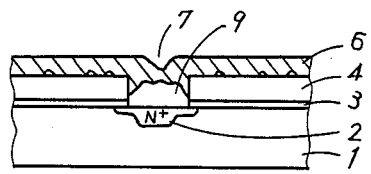
FIG. 3 illustrates a state in which silicon is precipitated in the interface between a metal film and a silicon substrate.
Figure 4:
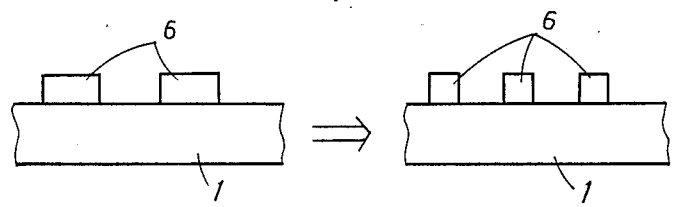
FIG. 4 illustrates the increase in the aspect ratio of a circuit pattern following refinement of an element.

FIG. 1 is a sectional view showing the structure of a semiconductor device according to an embodiment of the present invention. Referring to FIG. 1, a silicon oxide film 3 of about 1000 Å in thickness is formed by thermal oxidation on the surface of a silicon substrate 1. A silicon oxide film containing preferably 5 to 10 percent by weight of phosphorus and at least 1 percent, preferably 2 to 5 percent by weight of boron, i.e., a BPSG film 4 is formed on the silicon oxide film 3. Thereafter a contact hole 7 is selectively formed in the BPSG film 4 and the silicon oxide film 3 through photolithography or etching. Then an impurity diffusion layer 2 is formed in the vicinity of the surface of the silicon substrate 1 through ion implantation or thermal diffusion.

Then a first metal film 5 is formed on the BPSG film 4 and the impurity diffusion layer 2 through sputtering, CVD or the like, to serve as a barrier layer. The first metal film 5 comprises titanium-tungsten alloy (TiW), tungsten (W), titanium nitride (TiN), tantalum nitride (TaN), molybdenum silicide ($MoSi_2$), tungsten silicide ($WSi_2$), titanium silicide ($TiSi_2$), tantalum silicide ($TaSi_2$) or polysilicon, and most preferably comprises titanium nitride (TiN). Each metal is selected as that causing no alloy-spike phenomenon in the junction between the same and the silicon substrate 1 and to obtain low-resistance ohmic contact, while serving as an excellent diffusion barrier between aluminum and silicon.

Finally a second metal film 6 is formed on the first metal film 5 through sputtering, CVD or the like. The second metal film 6 is prepared by a film of aluminum containing silicon, alloy of aluminum, silicon and copper or aluminum element. Then the first and second metal films 5 and 6 are sintered by heat treatment.

With the BPSG film 4 serving as an insulating film also flattening the pattern surface, the structure as shown in FIG. 1 is effectively applied to a very-large-scale integrated circuit. The first metal film 5 prevents boron contained in the BPSG film 4 from being diffused in the second metal film 6 of aluminum containing silicon, while preventing precipitation of silicon in the interface between the silicon substrate 1 and a metal electrode caused by solid-phase epitaxial growth. More concretely, ohmic contact of less than 20$\Omega$ can be obtained with a contact hole of $1 \times 1$ $\mu m^2$ on an N+ diffusion layer. With such a structure, the second metal film 6 can be prepared of an aluminum element, and the first metal film 5 prevents an alloy-spike phenomenon between silicon and aluminum in this case.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a silicon substrate;
   a first silicon oxide film formed on the surface of said silicon substrate;
   a second silicon oxide film formed on said first silicon oxide film and containing boron and phosphorus;
   a contact hole selectively formed in said first and second silicon oxide films;
   an impurity diffusion layer formed on the surface layer of said silicon substrate at the bottom portion of said contact hole;
   a first metal film formed on said second silicon oxide film and said impurity diffusion layer to serve as a barrier layer; and
   a second metal film of aluminum alloy containing silicon formed on said first metal film to serve as a metal electrode;
   said first metal film comprising a material capable of preventing boron contained in said second silicon oxide film from being diffused into said second metal film.

2. A semiconductor device in accordance with claim 1, wherein said first metal film is a film of titanium nitride (TiN).

3. A semiconductor device in accordance with claim 1, wherein said first metal film is a film of titanium-tungsten alloy (TiW).

4. A semiconductor device in accordance with claim 1, wherein said first metal film is a film of tungsten (W).

5. A semiconductor device in accordance with claim 1, wherein said first metal film is a film of tantalum nitride (TaN).

6. A semiconductor device in accordance with claim 1, wherein said first metal film is a film of molybdenum silicide ($MoSi_2$).

7. A semiconductor device in accordance with claim 1, wherein said first metal film is a film of tungsten silicide ($WSi_2$).

8. A semiconductor device in accordance with claim 1, wherein said first metal film is a film of titanium silicide ($TiSi_2$).

9. A semiconductor device in accordance with claim 1, wherein said first metal film is a film of tantalum silicide ($TaSi_2$).

10. A semiconductor device in accordance with claim 1, wherein said first metal film is a polysilicon film.

11. A semiconductor device in accordance with claim 1, wherein:
    said second silicon oxide film contains at least one percent by weight boron.

12. A semiconductor device comprising:
    a silicon substrate;
    a first silicon oxide film formed on the surface of said silicon substrate;
    a second silicon oxide film formed on said first silicon oxide film and containing boron and phosphorus;
    a contact hole selectively formed in said first and second silicon oxide films;
    an impurity diffusion layer formed on the surface layer of said silicon substrate at the bottom portion of said contact hole;
    a first metal film formed on said silicon oxide film and said impurity diffusion layer to serve as a barrier layer; and
    a second metal film of aluminum alloy containing silicon formed on said first metal film to serve as a metal electrode;
    said first metal film being formed of a material which prevents boron contained in said second silicon oxide film form being diffused into said second metal film and which prevents precipitation of silicon in the contact hole between the silicon substrate and the metal electrode comprising the second metal layer.

13. A semiconductor device in accordance with claim 12 wherein said first metal film comprises titanium nitride.

* * * * *